United States Patent [19]

Guenther et al.

[11] Patent Number: 5,044,312

[45] Date of Patent: Sep. 3, 1991

[54] CONFORMAL COAT CONTACT INSERTION STRIP MASK

[75] Inventors: Bryan W. Guenther; Eric M. Frey, both of Tucson, Ariz.

[73] Assignee: Hughes Aircraft Company, Los Angeles, Calif.

[21] Appl. No.: 432,655

[22] Filed: Nov. 7, 1989

[51] Int. Cl.⁵ .................. B05C 13/00; B05D 1/32
[52] U.S. Cl. .................................. 118/505; 118/503; 118/504; 118/301; 269/254 R; 51/274
[58] Field of Search ............... 118/213, 301, 406, 500, 118/503, 504, 505; 269/1, 287, 900, 254 R, 265; 51/274

[56] References Cited

U.S. PATENT DOCUMENTS

| | | | |
|---|---|---|---|
| 687,862 | 12/1901 | Smith | 269/254 R |
| 2,869,169 | 1/1959 | Porter | 118/505 |
| 3,044,512 | 7/1962 | Jones | 269/254 R |
| 3,069,213 | 12/1962 | Azzarri | 118/503 |
| 3,414,502 | 12/1968 | Porrata et al. | 118/503 |
| 3,695,909 | 10/1972 | Fabre et al. | 118/301 |
| 3,741,563 | 6/1973 | Stenstrom | 269/287 |
| 4,068,792 | 1/1978 | Dixon | 118/505 |
| 4,505,010 | 3/1985 | Arenhold | 269/254 R |
| 4,815,198 | 3/1989 | Ramus | 118/505 |

FOREIGN PATENT DOCUMENTS 102088  11/1916  United Kingdom ................ 269/287

Primary Examiner—Richard V. Fisher
Assistant Examiner—Todd J. Burns
Attorney, Agent, or Firm—R. M. Heald; C. D. Brown; W. K. Denson-Low

[57] ABSTRACT

A mask for protecting edge conductors of printed circuit boards from the spray coating which is sprayed on the board. The mask is molded from a soft silicone-based-elastomer material in a configuration which presents a sharp sealing edge and a large interior angle adjacent the seal which effectively limits migration due to capillary action.

13 Claims, 2 Drawing Sheets

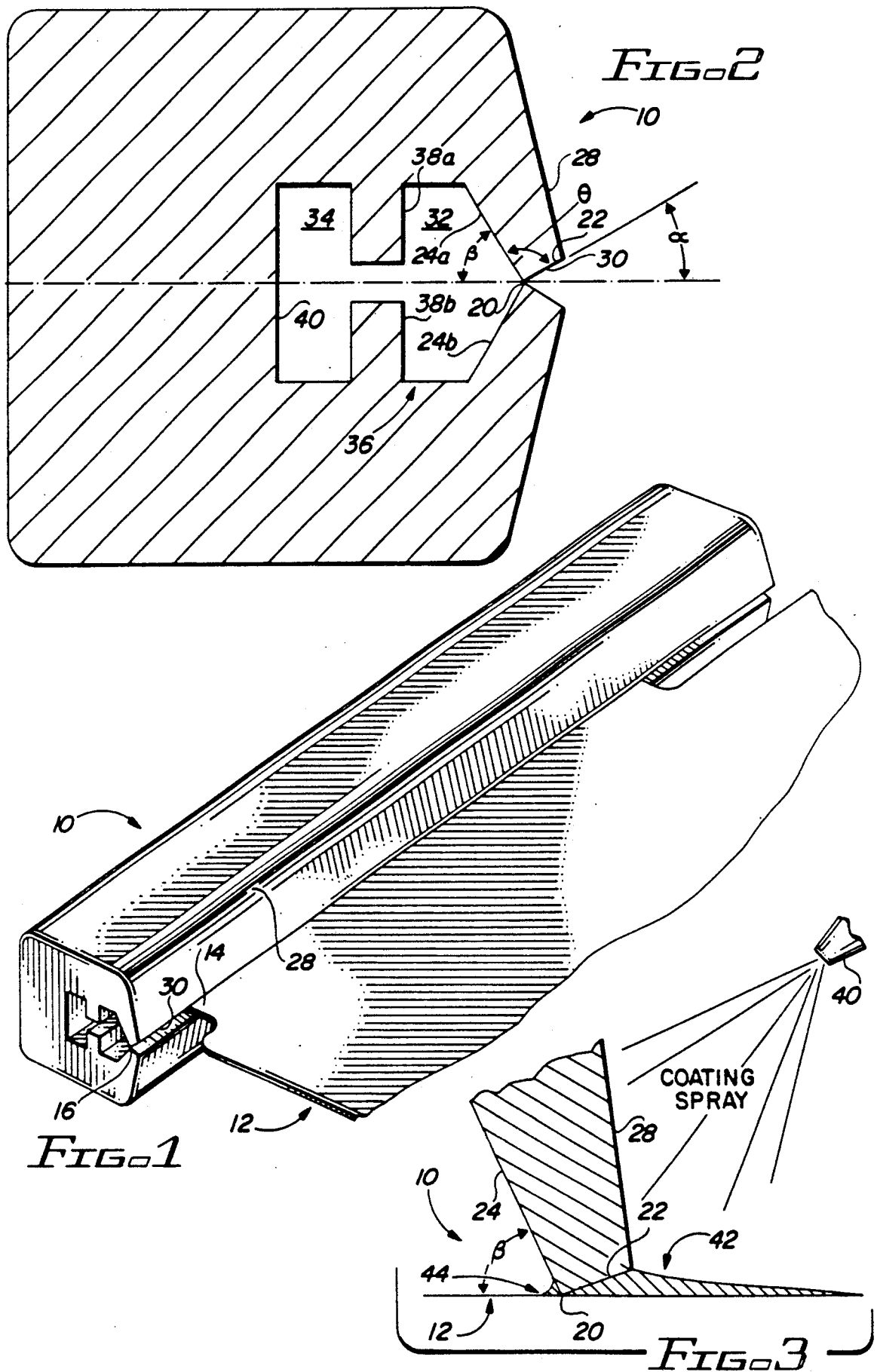

CONFORMAL COAT CONTACT INSERTION STRIP MASK

BACKGROUND OF THE INVENTION

1. Field of the Invention

This invention relates to the fabrication of contact insertion strips, printed circuit cards and the like and, more particularly, to the protection of particular contact elements thereof while spraying a conformal coating material during finishing such components.

2. Description of the Related Art

One of the final steps in the fabrication of electronic circuit boards is the spraying of a conformal protective coating of polyurethane, acrylic or like material over the printed circuit conductors and components installed on the board. It is important, however, that the circuit conductors on the card edges and insertion strips be kept free from coating, since the coating introduces an insulation material which interferes with the electrical connections which must be made when the board is inserted into a connector slot or other type of electrical connector.

Various efforts and implementations have been resorted to in the past to avoid the deleterious effects of the sprayed coating introduced on the edge conductors. Masking tape has been used on both contact insertion strips and card edges. A major drawback of masking tape is operator dependence. If the tape is not properly tooled down around irregularities on the board's surface, it is highly susceptible to seepage of the coating material. When the tape is removed, it leaves adhesive residue that must be cleaned off. In general, the use of tape for masking does not allow for the consistent location of the masking.

Dip sealing has been used, primarily on contact insertion strips. This involves a hot glue melt into which the board edge is dipped. This method results in very unreliable masking dimensions. Furthermore, the glue coating is difficult to remove from the boards. Dip seal residue on contact insertion strips results in board failure. Furthermore, dip sealing requires the use of a hot pot and a venting hood, and much more handling of the circuit boards.

Reusable masks have also been employed for final sealing. These masks are effective on card edges when acrylic coating is used and there are no irregularities on the board surface where the mask touches, such as conductor traces. Acrylic coating material exhibits less of a capillary effect than polyurethane material. However, these masks are not effective when a polyurethane coating is used. Furthermore, they are ineffective with either coating type on contact insertion strips. Moreover, a given size of mask is usable on only one board thickness.

Thus, the various approaches known in the prior art for solving the problem of protecting circuit board edge connectors against the effects of spraying the board with a protective conformal coating have not been satisfactory. What is needed, therefore, is an effective way of protecting the edge connectors during the spraying step which is reliable, repeatable and economical in terms of material and labor required. If a prefabricated mask is used, it should be adaptable in size to different board thicknesses.

SUMMARY OF THE INVENTION

In brief, arrangements in accordance with the present invention satisfy the need, and avoid the deleterious effects, of the prior art approaches to solving the problems which were expressed hereinabove. Embodiments of the invention comprise a conformal coat contact insertion strip/card edge mask which is a onepiece device molded from a soft silicone based elastomer having a Shore Durometer in the range of 30 to 40. A commercial elastomer marketed under the trademark Sylgard is a suitable material. The preferred embodiment of the invention is formed with a constant cross-sectional shape. The mask may be extruded instead of molded, if desired.

The preferred embodiment has a particular cross-sectional configuration providing a sharp sealing edge which results in a small area of contact with the board, thus increasing the effective sealing pressure and, in conjunction with the soft elastomer material of which it is constructed, permitting the mask to conform to irregularities on the board's surface. The small area of contact with the board reduces the region which is susceptible to capillary action.

The cross-sectional shape of the preferred embodiment includes a large angle inside the sealing lip of the mask. This large angle effectively stops any capillary action which may start in small gaps between the board and the mask. This angle also results in a rapid increase with distance from the sealing lip of the area in which capillary action can occur and consequently reduces the force of the capillary action. Any liquid migrating to the inside of the mask, past the sealing edge, forms a meniscus on the mask, and the surface tension of the liquid limits further infiltration.

The mask cross-section also includes a slight overhang which prevents buildup of coating at the sealing lip by protecting it from direct spray of the conformal coating. The mask cavity is also provided with a pair of adjacent protrusions which bear against the edge of the board and prevent the mask from rocking on the board, which would otherwise increase the area which is susceptible to capillary action.

Tests of the mask have shown that it is effective in protecting edge connectors of circuit boards against intrusion of both acrylic and polyurethane coatings. The locating dimensions of the mask are well controlled. A particular mask was reused ten times without visible deterioration of the mask or noted decrease in masking quality. A single mask has proven effective on boards ranging in thickness from 1/16" to ⅛, a 100% variation from the minimum (nominal) board size.

BRIEF DESCRIPTION OF THE DRAWINGS

In the accompanying drawings:

FIG. 1 is a schematic perspective view showing one particular arrangement in accordance with the invention;

FIG. 2 is a cross sectional view of the arrangement of FIG. 1;

FIG. 3 is a schematic view of a particular portion of the arrangement of FIG. 1, in use;

DESCRIPTION OF THE PREFERRED EMBODIMENT

Figure 4:
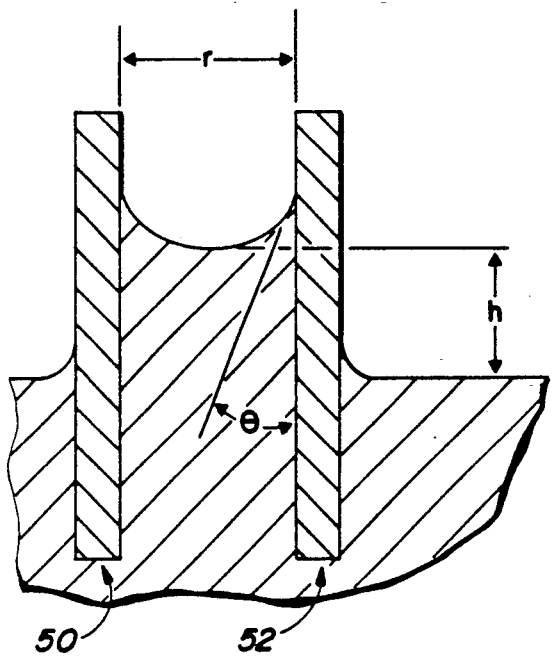
FIG. 4 is a sketch illustrating the development of capillary force between two adjacent parallel plates of like material.

FIG. 1 shows a mask 10 of the present invention in combination with a PC board 12 having a tongue-shaped contact insertion edge 14 inserted into edge opening 16 of the mask 10. Details of the mask 10 are better shown in the cross sectional view of FIG. 2. The mask 10 is shown to be symmetrical about a horizontal centerline. Each half may be considered to have a sharp sealing edge 20 formed by two adjacent wall surfaces, an outer wall 22 and an inner wall 24. The inner wall 24 intersects the centerline at an angle $\beta$. The outer edge of the wall 22 intersects an upper wall surface 28 at a point 30 (the line 30 in FIG. 1).

The two inside walls 24a, 24b partially define a first inner chamber 32 which is separated from a second inner chamber 34 of an interior cavity 36 by a pair of protrusions 38a and 38b. The angle which the outer wall 22 makes with the centerline is designated $\alpha$, thus making the entrance angle between the upper and lower outer walls 22 equal to $2\alpha$. The intersection at the sealing edge between the outer wall 22 and the inner wall 24 is designated 8. The card edge 14 or other element of an article such as the PC board 12 which is to be masked by the mask 10 is inserted along the centerline, separating slightly the two opposed sealing edges 20.

The block of material making up the mask 10 preferably comprises a soft silicone based elastomer of Shore A Durometer 30-40. This material exhibits a certain degree of resilience that permits the separation of the edges 20 to the extent necessary to receive a contact edge 14 while at the same time conforming to irregularities on the surfaces of the inserted edge 14. The symmetry of configuration of the mask device 10 about the horizontal centerline permits the device to perform effectively either side up. Thus, after the upper side of the board 12 as shown in FIG. 1 has been sprayed, the entire assembly can be turned over and the other side of the board can then be sprayed with the same masking effect being provided by the mask 10.

The schematic representation of FIG. 3 illustrates the effect of using the mask 10 during a spraying operation. It is not possible to eliminate all capillary action in the circumstances of using a mask device to inhibit migrating of coating spray onto protected contact areas. Instead, the preferred embodiment of the present invention provides a configuration which does not prevent capillary action but rather takes advantage of the fluid properties that cause such action to limit the region in which it can occur. The schematic view of FIG. 3 shows a portion of mask 10 in place against a portion of a PC board 12 to protect it against coating spray from a source 40. The source 40 is on the outside of the mask 10 and spray is generally applied to the major portion of the PC board 12 which is outside the mask 10 and the upper wall surface 28. The slight overhang afforded by the shape of the outer wall 22 and the upper wall 28 prevents build-up of coating on the sealing lip 20 by protecting the lip from direct spray. Although spray may build up, as at 42, on the outside of the sealing edge 20, only a very small amount, as at 44, is drawn past the edge 20 by the limited capillary force in the region of the angle $\beta$. The large angle $\beta$ inside the lip 20 stops any capillary action which may start in small gaps between the board 12 and the mask 10. Because of the large angle $\beta$, the distance between the inner wall 24 and the PC board 12 rapidly increases with distance from the edge 20 in the board direction. Thus, the area over which capillary action may occur spreads rapidly and the force of capillary action is quickly reduced with distance from the sealing edge 20. Once the liquid reaches the inside of the mask 10, it forms a meniscus on the mask and the surface tension of the liquid, shown in FIG. 3 in the form of a drop 44, prevents further infiltration.

The two protrusions 38 in the cavity 36 act to prevent the mask 10 from rocking on the board 12, an action which would otherwise increase the area which is susceptible to capillary action.

Figure 5:
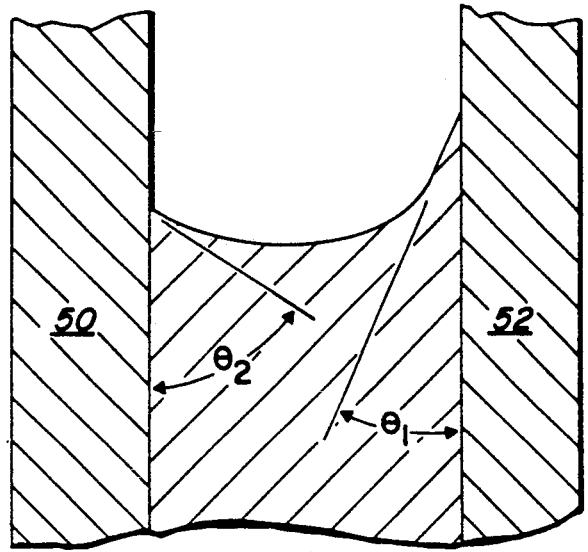
FIG. 5 is a similar sketch illustrating the development of capillary force between two plates of dissimilar materials.

The way in which the mask of the present invention takes advantage of the forces developed by capillary action may be better appreciated by a consideration of the following development of equations pertaining to capillary action. The governing equation for capillary action between two plates 50, 52 of similar materials and constant capillary gap (see FIG. 4) is the following:

$$h = \frac{2\sigma\cos\theta}{r\delta} \quad (1)$$

where
h = height of fluid
$\sigma$ = surface tension of fluid
$\theta$ = wetting angle
r = distance between plates
$\delta$ = density of fluid Different materials in the plates 50, 52, as in FIG. 5, could cause different wetting angles $\theta_1$, $\theta_2$, in which case $$h = \frac{2\sigma\cos[f(\theta_1,\theta_2)]}{r\delta} \quad (2)$$

$f(\theta_1,\theta_2)$ must work for all combinations of $\theta_1$ and $\theta_2$ from 0° to 180°. If $\theta_1$ equals $\theta_2$ then $f(\theta_1,\theta_2)=\theta_1$. This implies that $$f(\theta_1,\theta_2) = \frac{\theta_1 + \theta_2}{2} \quad (3)$$

$$h = \frac{2\sigma\cos\frac{(\theta_1 + \theta_2)}{2}}{r\delta} \quad (4)$$

Figure 6:
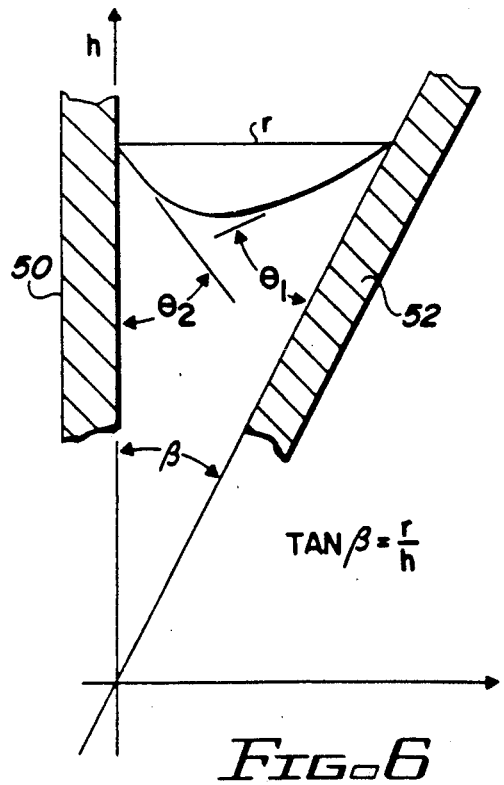
FIG. 6 is a similar sketch showing the development of capillary force between two non-parallel plates.
Figure 7:
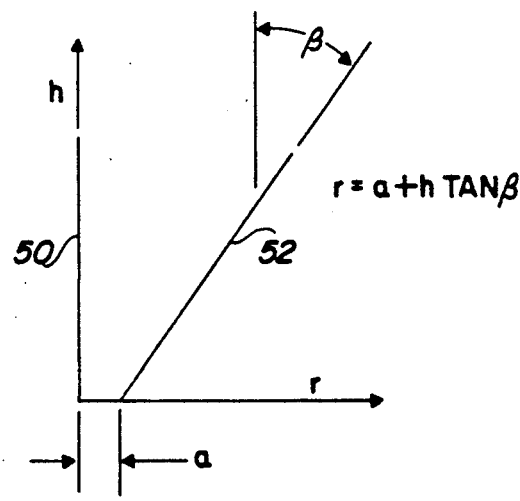
FIG. 7 is a graphical diagram similar to the sketch of FIG. 6.

If the distance between the plates varies as shown in FIG. 6, then r=f(h). In such a case, $$r = h \tan\beta \quad (5)$$

$$h = \frac{2\sigma\cos\frac{(\theta_1 + \theta_2)}{2}}{h\delta\tan\beta} \quad (6)$$

$$h^2 = \frac{2\sigma\cos\frac{(\theta_1 + \theta_2)}{2}}{\delta\tan\beta} \quad (7)$$

$$h = \sqrt{\frac{2\sigma\cos\frac{(\theta_1 + \theta_2)}{2}}{\delta\tan\beta}} \quad (8)$$

Where there is an initial gap width (a) between the plates 50, 52, as indicated in the sketch of FIG. 7, $$r = a + h \tan \beta \tag{9}$$

Equation (4) then becomes:

$$h = \frac{2\sigma \cos \frac{(\theta_1 + \theta_2)}{2}}{(a + h\tan\beta)\delta} \tag{10}$$

which can be expressed as:

$$h a + h^2 \tan\beta - \frac{2\sigma \cos \frac{(\theta_1 + \theta_2)}{2}}{\delta} = 0 \tag{11}$$

yielding the two roots:

$$h = \frac{-a \pm \sqrt{a^2 + 4\tan\beta \frac{2\sigma \cos \frac{(\theta_1 + \theta_2)}{2}}{\delta}}}{2\tan\beta} \tag{12}$$

If the average wetting angle is 90°, then the height (h) cannot be negative. Accordingly, $$h = \frac{-a + \sqrt{a^2 + 4\tan\beta \frac{2\sigma \cos \frac{(\theta_1 + \theta_2)}{2}}{\delta}}}{2\tan\beta} \tag{13}$$

This indicates that the angle $\beta$ should not be less than 45° for the mask 10 to develop the desired limitation of capillary effect. A value of 60° for the angle $\beta$ is preferred in order to limit the extent of liquid penetration under the sealing edge 20 due to capillary action as depicted in FIG. 3. In the preferred embodiment represented in FIG. 2, which is effective when used with printed circuit boards in the thickness range of 0.060–0.120 inch, $\beta = 60°$, $\alpha = 30°$. and $\theta = 90°$.

In one preferred embodiment, the depth of the cavity 36 from the sealing edge 20 at the inlet to the rear wall 48 was approximately 0.4 inch. The width of the protrusions 38 was approximately 0.063 inch. The width of the rear chamber 34 was approximately 0.1 inch. The height of the cavity was approximately 0.25 inch. The spacing between protrusions 38a, 38b was approximately 0.063 inch. The overall front-to-back dimension of the device 10 was approximately 0.75 inch. The height was also approximately 0.75 inch.

Thus, the configuration of the mask of the present invention effectively solves a problem of spray migration into inadequately protected contact areas which has heretofore been encountered in the spraying of printed circuit boards. The slight overhang of the "brow" formed by the intersection of the two outer wall surfaces causes the coating to shadow slightly, thereby reducing the buildup at the sealing edge and limiting the forces tending to drive the liquid coating past the sealing edge. This aspect of the invention enhances the effect of limitation of spray coating migration which is achieved by limiting capillary effect through development of the relatively large internal angle adjacent the sealing edge on the inside of the cavity. The mask of the present invention is a simple, durable, one-piece device, preferably molded from a soft silicone-based elastomer. Tests have included use with both acrylic and polyurethane coatings and the results have been eminently satisfactory. The mask is durable and can be reused repetitively without deterioration in structure or in effectiveness.

Although there have been shown and described hereinabove specific arrangements of a conformal coat contact insertion strip mask for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of the invention as defined in the annexed claims.

What is claimed is:

1. A masking device comprising:
   a block including an interior cavity sufficient in size to receive an edge portion of a contact insertion strip, said block including a pair of opposed, sharp sealing edges confronting opposite sides of said edge portion when inserted into said cavity;
   said block further including a pair of intersecting planar faces forming each sharp sealing edge, each pair of intersecting planar faces including an inner planar face defining a portion of said cavity and forming an angle $\beta$ of at least substantially 45° with respect to a center plane extending through said cavity; and
   means for maintaining said opposed sealing edges in tight edge contact with the opposite sides of said edge portion when inserted into said cavity, thereby protecting said edge portion from unwanted effects of spraying a conformal coat on said contact insertion strip.

2. The device of claim 1 wherein the length of said block and cavity are at least as great as the length of an insertion strip received within said cavity.

3. The device of claim 1 wherein the sealing edges are biased into contact with each other in the absence of an insertion strip received therebetween.

4. The device of claim 2 wherein the cross-section of said block is generally constant in shape throughout the length of the block.

5. The device of claim 1 wherein each pair of intersecting planar faces form an interior angle $\theta$ therebetween.

6. The device of claim 5 wherein each pair of intersecting planar faces includes an outer planar face defining a portion of said block and forming an angle $\alpha$ between said outer planar face and said center plane.

7. The device of claim 6 wherein the angle $\beta$ is not less than 45° nor more than 90°.

8. The device of claim 7 wherein the angle $\beta$ is 60°, the angle $\alpha$ is 30° and the angle $\theta$ is 90°, and said device is adaptable for use with printed circuit boards having edge portions in the thickness range of 0.060–0.120".

9. The device of claim 1 wherein the block in cross-section defines said interior cavity opening inwardly from said pair of opposed sealing edges and extending to a rear wall within said block.

10. The device of claim 9 wherein said cavity is separated into a plurality of chambers by a pair protrusions extending from opposed interior surfaces toward one another on opposite sides of the center plane.

11. The device of claim 10 wherein said pair of protrusions terminate short of contacting each other but are sufficiently close to the center plane to stabilize the edge portion of said insertion strip inserted into said cavity.

12. The device of claim 1 further including means for aligning an insertion strip within said cavity.

13. The device of claim 6 wherein each of said outer planar faces extend outwardly from its adjacent sealing edge sufficiently to catch a portion of the spray directed at the insertion strip and thereby limit the extent of spray buildup at said sealing edge.

* * * * *